United States Patent
Berke et al.

(10) Patent No.: US 8,097,979 B2
(45) Date of Patent: Jan. 17, 2012

(54) SYSTEM AND METHOD FOR OPTIMIZING REGULATED VOLTAGE OUTPUT POINT

(75) Inventors: Stuart A. Berke, Austin, TX (US); Kunrong Wang, Austin, TX (US)

(73) Assignee: Dell Products, LP, Round Rock, TX (US)

(*) Notice: Subject to any disclaimer, the term of this patent is extended or adjusted under 35 U.S.C. 154(b) by 366 days.

(21) Appl. No.: 12/362,157

(22) Filed: Jan. 29, 2009

(65) Prior Publication Data
US 2010/0187906 A1    Jul. 29, 2010

(51) Int. Cl.
*H02J 3/14*    (2006.01)
(52) U.S. Cl. .......................................... 307/31
(58) Field of Classification Search .............. 307/31; 324/76.11–157; 702/183–199, 118–126
See application file for complete search history.

(56) References Cited

U.S. PATENT DOCUMENTS

| | | | |
|---|---|---|---|
| 5,917,312 A | 6/1999 | Brkovic | |
| 6,472,856 B2 | 10/2002 | Groom et al. | |
| 6,928,561 B2 | 8/2005 | Farkas et al. | |
| 7,080,268 B2 | 7/2006 | Mosley | |
| 7,098,637 B2 | 8/2006 | Jauregui et al. | |
| 7,307,433 B2* | 12/2007 | Miller et al. | 324/756.03 |
| 7,317,306 B2 | 1/2008 | Fite | |
| 7,319,312 B2 | 1/2008 | Leung et al. | |
| 7,577,859 B2* | 8/2009 | Bilak | 713/320 |
| 7,684,962 B2* | 3/2010 | Kenworthy | 702/186 |
| 7,848,172 B2* | 12/2010 | Dudeck et al. | 365/227 |
| 7,903,483 B2* | 3/2011 | Russell et al. | 365/200 |
| 2004/0186837 A1 | 9/2004 | Lambert et al. | |

* cited by examiner

*Primary Examiner* — Albert W Paladini
(74) *Attorney, Agent, or Firm* — Larson Newman, LLP

(57) ABSTRACT

A device includes a plurality of voltage regulators, and a test module. Each of the voltage regulators are configured to provide a regulated voltage to one of a plurality of subsystems. The test module is in communication with the voltage regulators, and is configured to perform a subsystem component inventory for each of the subsystems at a start of a power-on self-test of the device, to determine a configuration of the device. The test module is also configured to capture first voltage data for the subsystems during an idle operation, to capture second voltage data for the subsystems during a stressed operation, and to set a voltage set point for each of the regulated voltages provided by one of the voltage regulators based on the subsystem component inventory, a power requirement table, or the first and second voltage data.

19 Claims, 5 Drawing Sheets

SYSTEM AND METHOD FOR OPTIMIZING REGULATED VOLTAGE OUTPUT POINT

FIELD OF THE DISCLOSURE

This disclosure generally relates to information systems, and more particularly relates to a system and method for optimizing a regulated voltage output point.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Servers can have a large number of possible configurations based on different components being added to and/or removed from the servers. The components can include central processing units (CPUs), dual in-line memory modules (DIMMs), hard disk drives (HDDs), peripheral component interconnect (PCI) option cards, and the like. Depending on the number and different types of components in a specific configuration, the power and cooling requirements for the configuration can vary. Typically, the power and cooling requirements for the server are designed to accommodate the maximum power operating condition. Regulated voltage outputs for the components also can be optimized for maximum power configurations, such that the power requirements can be met for the wide range of configurations. Additionally, the regulated voltage outputs can have a target voltage point that is set, so that the desired operating voltage range can be maintained.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
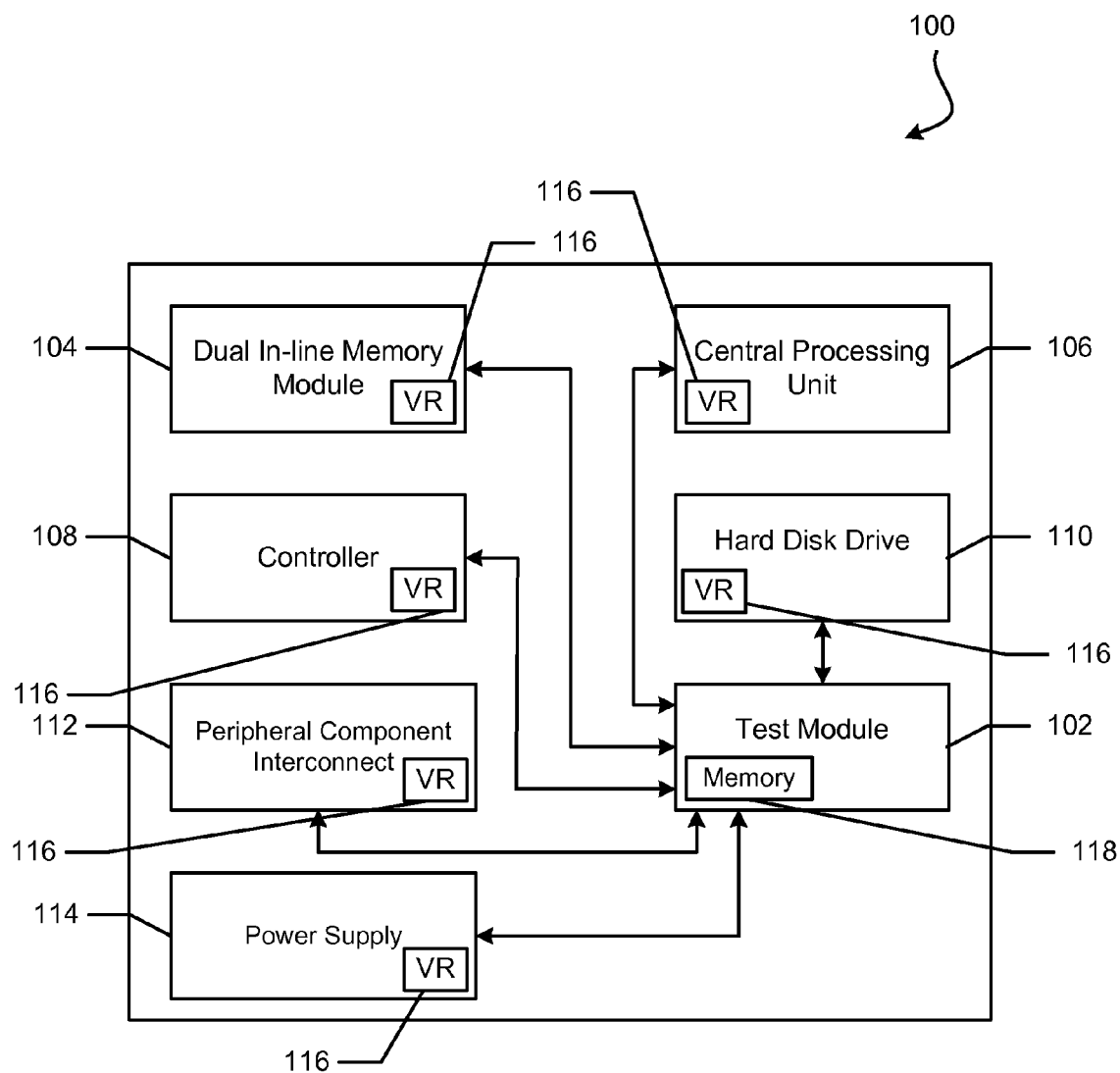
FIG. 1 is a block diagram of an information handling system.

FIG. 1 shows an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The information handling system 100 includes a test module 102, a DIMM 104, a CPU 106, a controller 108, an HDD 110, a PCI 112, a power supply 114, a plurality of voltage regulators (VRs) 116, and a memory 118. The test module 102 is in communication with the DIMM 104, with the CPU 106, with the controller 108, with the HDD 110, with the PCI 112, with the power supply 114, and with the plurality of VRs 116. Each of the CPU 106, the controller 108, the HDD 110, the PCI 112, and the power supply 114 are in communication with one of the VRs 116, which include both direct current to direct current (DC-DC) regulators and alternating current to direct current (AC-DC) regulators usually provisioned within the power supply 114. The test module 102 includes the memory 118.

Upon the information handling system 100 being powered on, a power-on self-test (POST) can be performed for the information handling system by the test module 102. During the POST, the test module 102 can determine a configuration for the information handling system 100, such as the specific components located within the information handling system. The configuration of the information handling system 100 can include any combination of the DIMM 104, the CPU 106, the controller 108, the HDD 110, and the PCI 112. Additionally, the test module 102 can determine different characteristics about the DIMM 104, the CPU 106, the controller 108, the HDD 100, and the PCI 112. The different characteristics can include the speed of the components, the size of the components, the number of the components, and the like.

Figure 2:
FIG. 2 is a schematic diagram illustrating a power requirement table stored in a memory of the information handling system.

The test module 102 can compare the configuration and the different characteristics of the components to data tables, such as a power requirement table 200 shown in FIG. 2, stored in the memory 118. The power requirement table 200 can include columns for the different types of components, such as a CPU column 202, a memory column 204, a storage controller column 206, an HDD column 208, and a PCI column 210. The power requirement table 200 can also include an amount of power to be budgeted column 212 based on the configuration of the information handling system 100. Each row in the power requirement table 200 can be a different possible configuration for the information handling system 100, such as configurations 214 and 216.

For example, the power requirement table 200 can include the configuration 214 such that the CPU column 202 can include two CPUs 106 running at 60 watts, the memory column 204 can include six one gigabyte memory devices that operate at 1333 megahertz, the storage controller column 206 can include a serial attached small computer system interface controller (SAS) controller, the HDD column 208 can include one HDD 110 that is two and one-half inches in diameter, and the PCI column 210 can be empty. Thus, if the configuration for the information handling system 100 matches the configuration 214 of the power requirement table 200, the total amount of power that may be budgeted for the configuration is 386 watts, as represented in the first cell of the budgeted power column 212.

The power requirement table 200 can also include the configuration 216 such that the CPU column 202 can include two CPUs 106 running at 130 watts, the memory column 204 can include twelve sixteen gigabyte memory devices that operate at 1067 megahertz, the storage controller column 206 can include a SAS Redundant Array of Independent Disks (RAID) Controller, the HDD column 208 can include eight HDDs 110 that are two and one-half inches in diameter, and the PCI column 210 can be two PCIs 112 running at 25 watts with an additional 15 watt requirement. Thus, if the configuration for the information handling system 100 matches the configuration 216 of the power requirement table 200, the total amount of power that may be budgeted for the configuration is 921 watts, as represented in the sixth cell of the budgeted power column 212.

The test module 104 can set each of the VRs 116 to have a target regulated output voltage based on the information obtained for each of the components in the information handling system 100 during the POST, and based on the information from the power requirement table 200. For example, if the test module 102 determines that the information handling system 100 has the configuration 214, the test module can lower the target operating voltage range for each of the VRs 116 from a worst case range to a range associated with the amount of power that may be budgeted column 212 as shown in the power requirement table 200 of FIG. 2. The test module 102 can also reduce a remote sense point for the VRs 116 based on the configuration 214. The remote sense point can be a specific output voltage set for the VRs 116. Thus, if the measured output voltage of the VRs 116 is different than the remote sense point, the VRs can be adjusted to provide a desired output voltage that is substantially equal to the remote sense point voltage.

During the POST, the test module 102 can also create idle and stressed operations for the different components. For example, the test module 102 can create the idle operation by allowing the components to operate at a lowest operating level, and the test module can create the stressed operation by causing the components to operate at a maximum operating level. The test module 102 can then receive voltage and/or current measurements for the different components for both the idle and stressed operations. The voltage and/or current measurements can be used to further determine the power requirements for each of the components. Thus, the test module 102 can use these measurements to refine the target regulated output voltage for the VRs 116 of the components.

Figure 3:
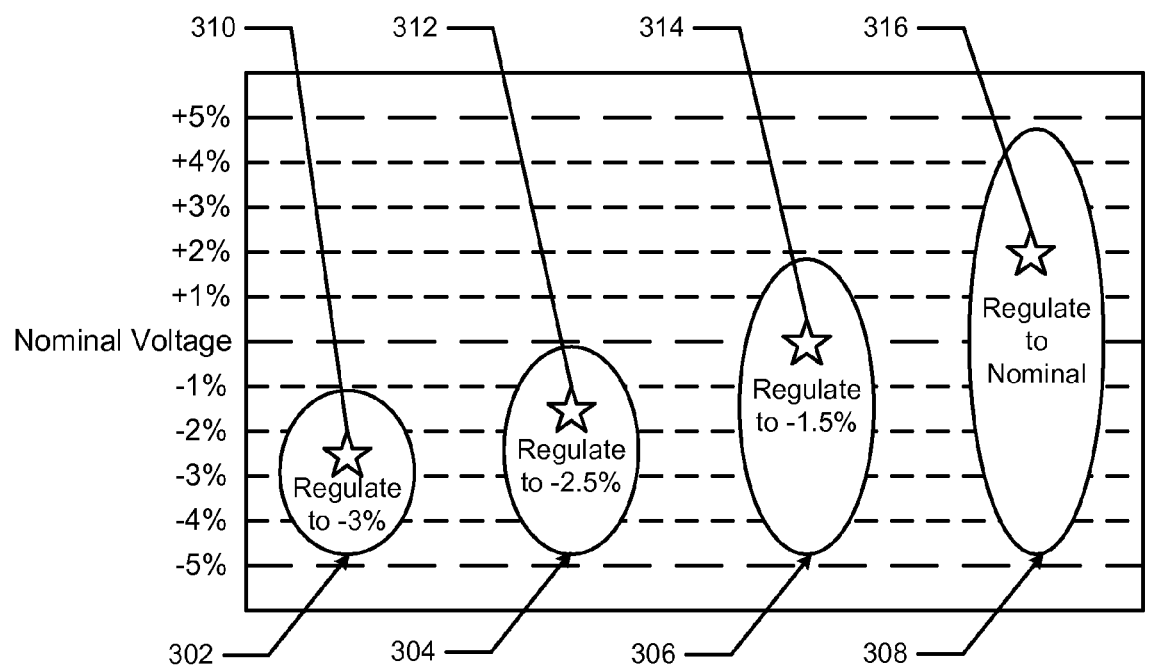
FIG. 3 is a plurality of graphical representations of operating voltage ranges for the information handling system.

FIG. 3 shows a plurality of exemplary operating voltage ranges for the information handling system 100 including a minimum configuration operating voltage range 302, a typical configuration operating voltage range 304, a maximum configuration operating voltage range 306, and a maximum configuration worst case operating voltage range 308. The minimum configuration operating voltage range 302 can have a remote sense point 310 that is originally set at two and one-half percent below the nominal voltage so that the operating voltage can be maintained within a negative one to negative five percent range of the nominal operating voltage. The typical configuration operating voltage range 304 can have a remote sense point 312 that is originally set at one and one-half percent below the nominal voltage so that the operating voltage can be maintained within a nominal to negative five percent range of the nominal operating voltage.

The maximum configuration typical power operating voltage range 306 can have a remote sense point 314 that is originally set at the nominal voltage so that the operating voltage can be maintained within a two to negative five percent range of the nominal operating voltage. The maximum configuration worst case power operating voltage range 308 can have a remote sense point 316 that is originally set at two percent above the nominal voltage so that the operating voltage can be maintained within a five to negative five percent range of the nominal operating voltage. Based on the configuration of the information handling system 100 and on the voltage and/or current measurements, the test module 102 can refine the remote sense points 310, 312, 314, and 316 so that the output voltage of the VRs 116 can remain with the operating voltage ranges 302, 304, 306, and 308.

Figure 4:
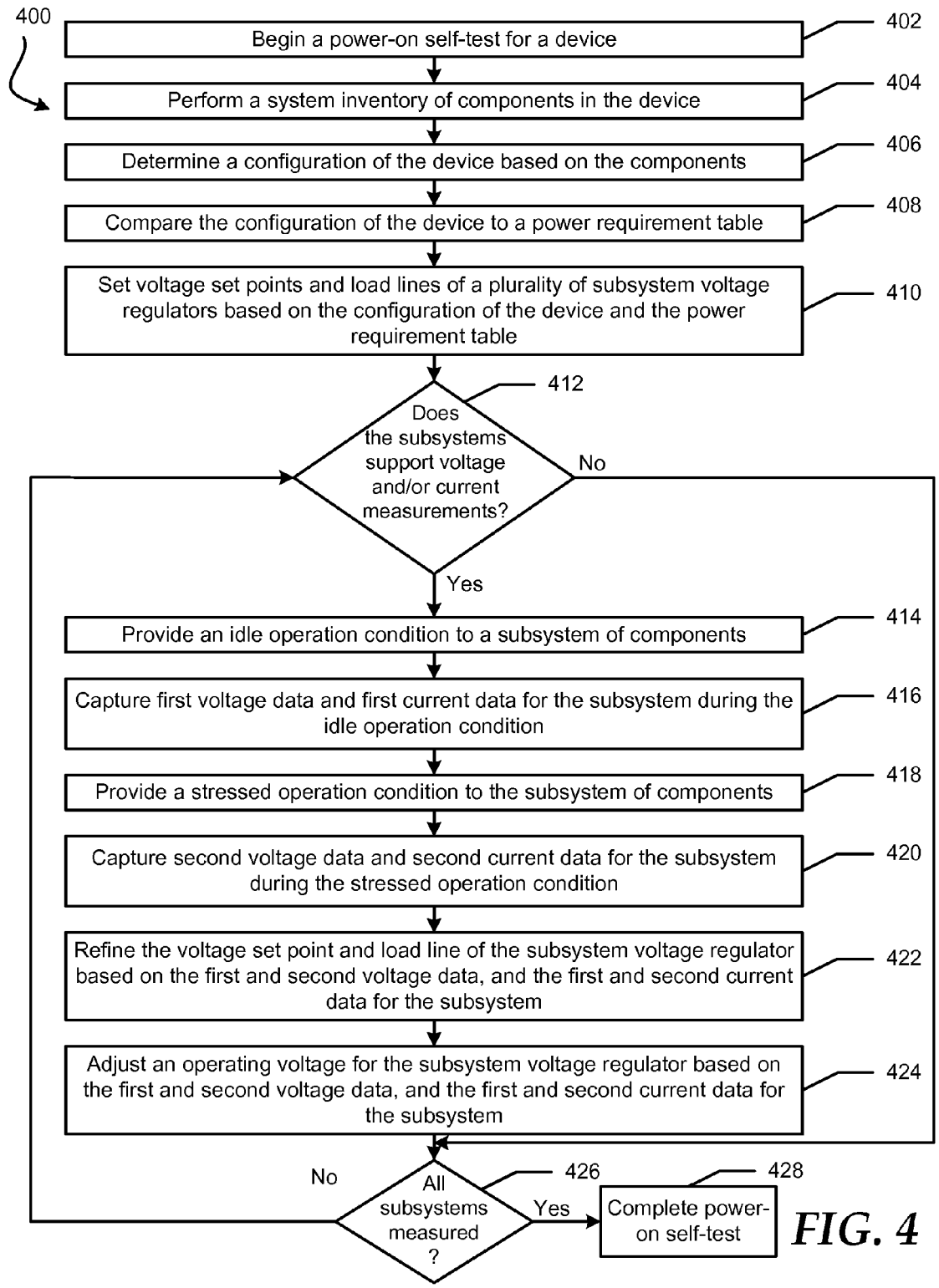
FIG. 4 is a flow diagram of a method for setting a plurality of subsystem voltage regulators for the information handling system.

FIG. 4 shows a flow diagram of a method 400 for setting the subsystem voltage regulators for the information handling system 100. At block 402, a power-on self-test is begun. A system inventory of components in the device is performed at block 404. At block 406, a configuration of the device is determined based on the components. The configuration of the device is compared to a power requirement table at block 408. At block 410, a the voltage set points and optionally load lines of a plurality of subsystem voltage regulators are set based on the configuration of the device, and based on the power requirement table.

At block 412, a determination is made whether each subsystem supports voltage and/or current measurements. If the subsystem does not support voltage and/or current measurements, the flow diagram skips to block 426. However, if the subsystems support voltage and/or current measurements, an idle operation condition is provided to a subsystem of components at block 414. At block 416, first voltage data and first current data for the subsystem are captured during the idle operation condition. A stressed operation condition is provided to the subsystem of components at block 418. At block 420, second voltage data and second current data are captured for the subsystem during the stressed operation condition.

At block 422, if applicable data was captured at blocks 414-420, the voltage set point and load line of the subsystem voltage regulator is refined based on the first and second voltage data, and the first and second voltage current data for the subsystem. The refinement process takes into consideration the measured values and optionally, predetermined additional design margin. An operating voltage for the subsystem voltage regulator is adjusted based on the first and second voltage data, and based on the first and second current data for the subsystem at block 424. At block 426, a determination is made whether all of the subsystems have been measured. If all of the subsystems have not been measured the flow diagram continues as described above at block 412. The loop from block 412 to block 426 continues until all of the subsystems have been measured. Upon all of the subsystems being measured, the POST is completed at block 428.

Figure 5:
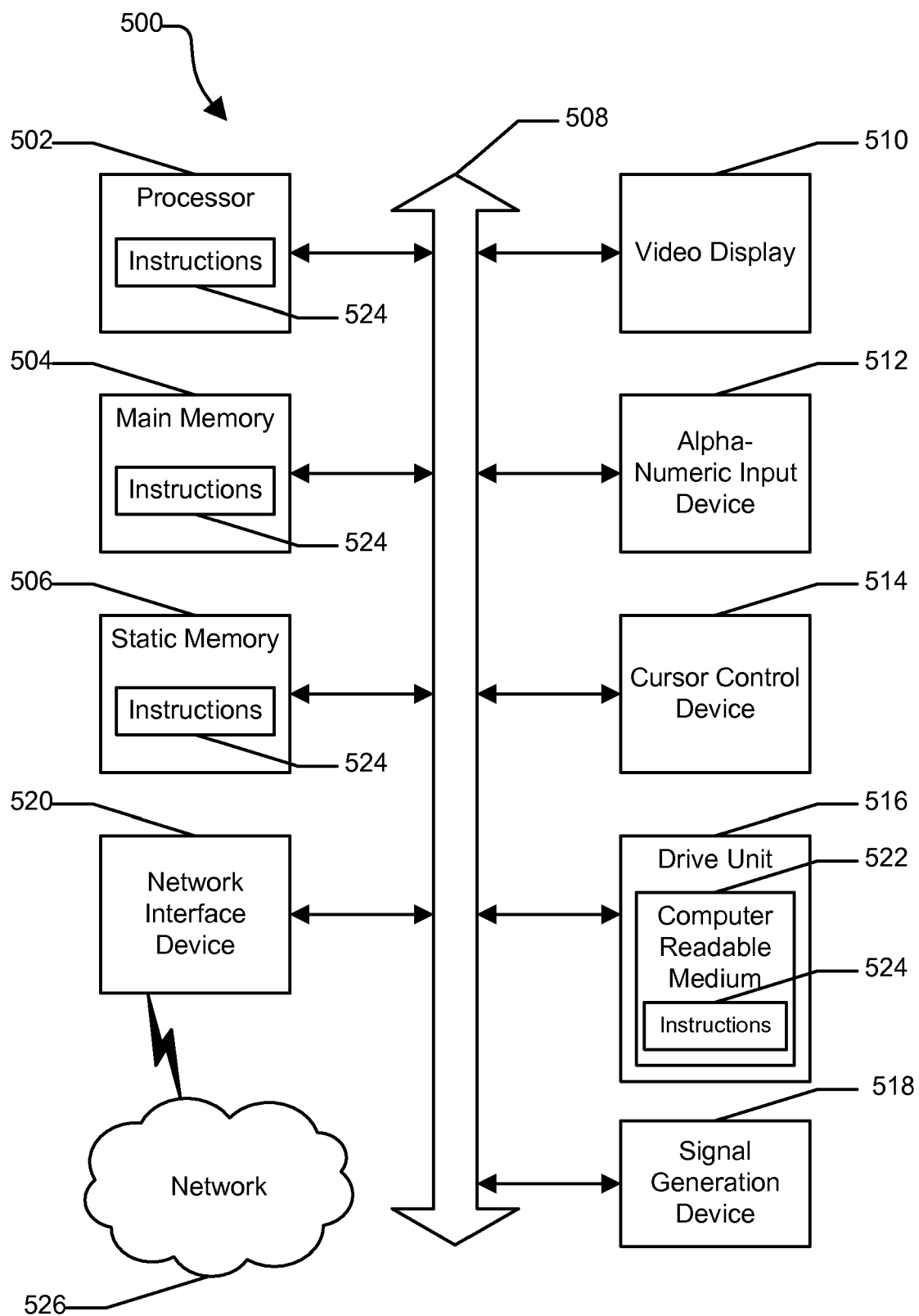
FIG. 5 is a block diagram of a general computer system.

FIG. 5 shows an illustrative embodiment of a general computer system 500 in accordance with at least one embodiment of the present disclosure. The computer system 500 can include a set of instructions that can be executed to cause the computer system to perform any one or more of the methods or computer based functions disclosed herein. The computer system 500 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 500 can be implemented using electronic devices that provide voice, video or data communication. Further, while a single computer system 500 is illustrated, the term "system" shall also be taken to include any collection of systems or sub-systems that individually or jointly execute a set, or multiple sets, of instructions to perform one or more computer functions.

The computer system 500 may include a processor 502, e.g., a central processing unit (CPU), a graphics processing unit (GPU), or both. Moreover, the computer system 500 can include a main memory 504 and a static memory 506 that can communicate with each other via a bus 508. As shown, the computer system 500 may further include a video display unit 510, such as a liquid crystal display (LCD), an organic light emitting diode (OLED), a flat panel display, a solid state display, or a cathode ray tube (CRT). Additionally, the computer system 500 may include an input device 512, such as a keyboard, and a cursor control device 514, such as a mouse. The computer system 500 can also include a disk drive unit 516, a signal generation device 518, such as a speaker or remote control, and a network interface device 520.

In a particular embodiment, as depicted in FIG. 5, the disk drive unit 516 may include a computer-readable medium 522 in which one or more sets of instructions 524, e.g. software, can be embedded. Further, the instructions 524 may embody one or more of the methods or logic as described herein. In a particular embodiment, the instructions 524 may reside completely, or at least partially, within the main memory 504, the static memory 506, and/or within the processor 502 during execution by the computer system 500. The main memory 504 and the processor 502 also may include computer-readable media. The network interface device 520 can provide connectivity to a network 526, e.g., a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 524 or receives and executes instructions 524 responsive to a propagated signal, so that a device connected to a network 526 can communicate voice, video or data over the network 526. Further, the instructions 524 may be transmitted or received over the network 526 via the network interface device 520.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A device comprising:
   a plurality of voltage regulators, each configured to provide a regulated voltage to one of a plurality of subsystems; and
   a test module in communication with the voltage regulators, the test module configured to perform a subsystem component inventory for each of the subsystems at a start of a power-on self-test of the device, to determine a configuration of the device based on the subsystem component inventory for each of the subsystems, to capture first voltage data for the subsystems during an idle operation, to capture second voltage data for the subsystems during a stressed operation, and configured to set a voltage set point for each of the regulated voltages provided by one of the voltage regulators based on the subsystem component inventory.

2. The device of claim 1 wherein the test module is further configured to refine the voltage set point for one of the voltage regulators based on the first and second voltage data.

3. The device of claim 1 wherein the test module is further configured to set a load line associated with one of the voltage regulators based on the configuration of the device.

4. The device of claim 1 wherein the test module is further configured to adjust an operating voltage for one of the voltage regulators based on the first and second voltage data.

5. The device of claim 1 wherein the test module is further configured to provide the idle operation to the subsystems.

6. The device of claim 1 wherein the test module is further configured to provide the stressed operation to the subsystems.

7. A computer readable medium comprising a plurality of instructions to manipulate a processor, the plurality of instructions comprising:
   instructions to perform a system inventory of components in a device at a start of a power-on self-test of the device;
   instructions to determine a configuration of the device based on the system inventory of the components;
   instructions to set a voltage set point for each of a plurality of subsystem voltage regulators based on the configuration of the device;
   instructions to capture first voltage data for a plurality of subsystems during an idle operation;
   instructions to capture second voltage data for the plurality of subsystems during a stressed operation; and
   instructions to refine the plurality of subsystem voltage regulators based on the first and second voltage data.

8. The computer readable medium of claim 7 further comprising:
   instructions to refine the voltage set point for one of the subsystem voltage regulators based on the first and second voltage data.

9. The computer readable medium of claim 7 further comprising:
   instructions to set a load line associated with one of the subsystem voltage regulators based on the configuration of the device.

10. The computer readable medium of claim 7 further comprising:
    instructions to adjust an operating voltage for one of the subsystem voltage regulators based on the first and second voltage data.

11. The computer readable medium of claim 7 further comprising:
    instructions to provide the idle operation to the components in the device prior to capturing the first voltage data.

12. The computer readable medium of claim 7 further comprising:
    instructions to provide the stressed operation to the components in the device prior to capturing the second voltage data.

13. A computer readable medium comprising a plurality of instructions to manipulate a processor, the plurality of instructions comprising:
    instructions to perform a system inventory of components in a device at a start of a power-on self-test of the device;
    instructions to determine a configuration of the device based on the system inventory of the components;
    instructions to compare the configuration of the device to a power requirement table;
    instructions to set a voltage set point for each of a plurality of subsystem voltage regulators based on the configuration of the device and the power requirement table;
    instructions to capture first current data for a plurality of subsystems during an idle operation;
    instructions to capture second current data for the plurality of subsystems during a stressed operation; and
    instructions to refine the plurality of subsystem voltage regulators based on the first and second current data.

14. The computer readable medium of claim 13 further comprising:
    instructions to refine the voltage set point for one of the subsystem voltage regulators based on the first and second current data.

15. The computer readable medium of claim 13 further comprising:
    instructions to set a load line associated with one of the subsystem voltage regulators based on the configuration of the device and the power requirement table.

16. The computer readable medium of claim 13 further comprising:
    instructions to adjust an operating voltage for one of the subsystem voltage regulators based on the first and second current data.

17. The computer readable medium of claim 13 further comprising:
    instructions to provide the idle operation to the components in the device prior to capturing the first current data.

18. The computer readable medium of claim 13 further comprising:
    instructions to provide the stressed operation to the components in the device prior to capturing the second current data.

19. The computer readable medium of claim 13 wherein the power requirement table includes a maximum power requirement and a minimum power requirement for a plurality of configurations of the device.

* * * * *